US005590049A

United States Patent [19]
Arora

[11] Patent Number: 5,590,049
[45] Date of Patent: Dec. 31, 1996

[54] METHOD AND SYSTEM FOR USER PROGRAMMABLE DESIGN VERIFICATION FOR PRINTED CIRCUIT BOARDS AND MULTICHIP MODULES

[75] Inventor: Sandeep Arora, Boston, Mass.

[73] Assignee: Cadence Design Systems, Inc., San Jose, Calif.

[21] Appl. No.: 302,329

[22] Filed: Sep. 7, 1994

[51] Int. Cl.⁶ .................................................. G06F 17/50
[52] U.S. Cl. ........................................ 364/489; 364/488
[58] Field of Search .................................. 364/490, 489, 364/488, 578

[56] References Cited

U.S. PATENT DOCUMENTS

| | | | |
|---|---|---|---|
| 5,402,357 | 3/1995 | Schaefer et al. | 364/490 |
| 5,450,331 | 9/1995 | Lin et al. | 364/490 |
| 5,487,018 | 1/1996 | Loos et al. | 364/489 |
| 5,493,508 | 2/1996 | Dangelo et al. | 364/489 |
| 5,497,334 | 3/1996 | Russell et al. | 364/489 |

*Primary Examiner*—Vincent N. Trans
*Attorney, Agent, or Firm*—Fenwick & West LLP

[57] ABSTRACT

A method and system for verifying design constraints on printed circuit boards and multichip modules provides for user programmability and design of new constraints and applicable verification procedures for verifying the constraints. New constraints are defined, identifying various attributes dealing with the circuit elements to which the constraint is applied, and precedence of the constraint with respect to existing constraints on circuit element. A verification procedure is defined for the constraint, and the verification procedure is registered in a constraint verification library such that it can be retrieved when an circuit element is supplied to a verification engine for verification of applicable design constraints on the circuit element.

9 Claims, 4 Drawing Sheets

| | |
|---|---|
| Constraint Definition Name | 401 |
| Constraint Identity | 403 |
| Constraint by Substrate | 405 |
| Constraint Attribute Identity | 407 |
| Class Attribute Identity | 409 |
| Constraint Data Type | 411 |
| Constraint Units Type | 413 |
| Constraint Operation Flag | 415 |
| Constraint Dimension | 417 |
| Constraint Precedence | 419 |
| Object List | 421 |
| Conserative Function Pointer | 423 |
| Defer Check Flag | 425 |
| Delete Function Flag | 427 |

METHOD AND SYSTEM FOR USER PROGRAMMABLE DESIGN VERIFICATION FOR PRINTED CIRCUIT BOARDS AND MULTICHIP MODULES

BACKGROUND

1. Field of the Invention

The present invention relates generally to the field of automated design techniques for electronic circuits, and more particularly to methods and systems for verifying constraints during the layout design of a printed circuit board or multichip module.

2. Description, of the Background Art

An essential part of the design process for printed circuit boards and multichip modules is the definition of electrical, geometrical, and timing constraints that control the placement of circuit components on the circuit board, and the performance characteristics of the components. Geometrical constraints specify the relative distances and positions of circuit elements with respect to one another, such as the position of ground lines with respect to power lines. Electrical constraints define the electrical properties to be maintained by the circuit elements, such as current or voltage limitations, and the like. Timing constraints define the performance requirements of the circuit, specifying the minimum or maximum times for a circuit element to propagate its input signals. Heat constraints define operating ranges or maximums for heat buildup and dissipation. The designer typically defines a variety of different constraints for the different types of circuit elements, and properties of the circuit, such as requiring a minimum spacing between all signal paths. In many cases the designer will specify a specific constraint value for a specific circuit element, overriding any generally defined constraint for the circuit element.

During the design of the circuit, and after the definition of the constraints for the circuit elements have been defined, a number of design verification processes are implemented to test the accuracy and correctness of the design. One of the design verification processes is to test whether all of the specified constraints for all the circuit elements have been satisfied in the design. It is typical that many constraints are not satisfied due to the complexity of most circuit designs, such as multichip modules, so accurate verification of the constraints is critical to ensuring that the final circuit meets its specifications.

A typical design verification program has a verification engine with integral verification procedures for testing and verifying the types of constraints used in the design environment. Because the verification procedures are part of the verification engine, the design program is typically able to verify constraints that are allowed in the design environment. Accordingly, it is very difficult for any given design program to accommodate the rapid developments in fabrication and design technologies that require numerous new types of constraints to be defined and applied, and new verification procedures developed to verify the constraints.

Some systems partially address this problem by implementing new verification procedures directly into the verification engine. However, this restricts the designer to using only those constraints that can be verified by the current version of the design verification program he is using, and waiting for a new version to be provided by the program's vendor before implementing new constraints.

In addition, in many cases the designer may desire to implement his own constraints, ones that may not be applicable to use by other users of the design environment. However, the designer is typically unable to define his own constraints as needed or to devise his own verification procedures because they are coded into the verification engine. Thus he is limited to the using the constraints provided by the design environment and cannot customize it to his needs.

It is desirable therefore, to provide a design verification system and method that allows new constraints to be added by the designer as desired, and new verification procedures can be provided to the verification engine. This would liberate the designer from being limited to the capabilities of a fixed design environment that is only able to handle a limited range of constraint types.

SUMMARY OF THE INVENTION

A design verification method provides for user programmability of the constraints of circuit layout by defining a design constraint for a selected component of the circuit, defining a verification procedure in a programming interface, such that the verification procedure remains independent of a verification engine, and then executing the verification procedure with the verification engine. A further refinement of the method includes providing a database of hierarchical components for creating the electronic circuit, where each component has a component type, a design constraint, and is either a primitive circuit element or a subhierarchical component, and then defining the electronic circuit as a hierarchy of interconnected components, each subhierarchical component inheriting the design constraints of any component including the subhierarchical component. The inheritance of design constraints facilitates the verification process by allowing the ordering of constraints based on the hierarchical relations of the circuit components.

A computer automated design system also provides for user programmability of constraints and verification procedures, and includes a processor, a component library, a circuit memory, a constraint memory, a programming interface, managed by the processor, for defining the verification procedure verifying the design constraint, a procedure memory, coupled to the programming interface, for storing the verification procedure, and a design verification engine controlling the processor to execute a verification procedure verifying the design constraint of the component.

BRIEF DESCRIPTION OF THE DRAWINGS

FIG. 4 is an illustration of the data structure of a constraint.

DESCRIPTION OF THE PREFERRED EMBODIMENT

Figure 1:
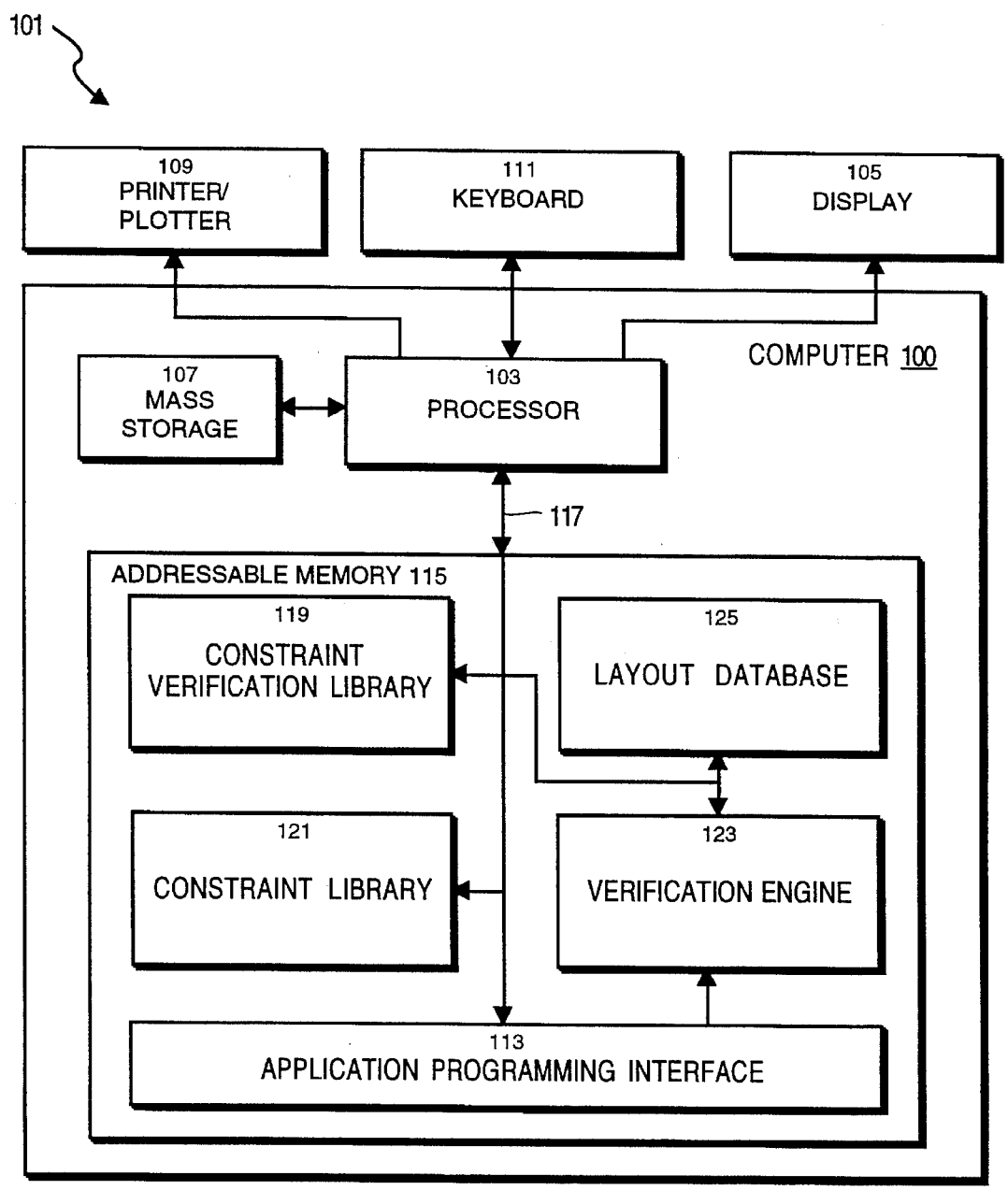
FIG. 1 is a block diagram of the design verification system of the invention.

Referring now to FIG. 1 there is shown a design verification system 101 for providing user programmability of constraints and design verification procedures for verifying constraints. The preferred embodiment of the system is implemented on a general purpose computer such as a Sun Microsystems, Inc. Sparc™ workstation. Utilizing dedicated software, the general purpose computer specifically configures memory and system peripherals for the purpose of executing the method of the present invention.

The design verification system 101 includes a processor 103, a display 105, a mass storage device 107, a printer 109, a keyboard 111, an application programming interface 113 and an addressable memory 115. The display 105 provides a graphical user interface to the system 101, and allows the designer to graphically design a printed circuit board or multichip module, and to create and input values for constraints, and to view and correct circuit elements during the design process. The printer 109 generates a permanent record of the printed circuit layout, constraint values, and related information. The keyboard 111 accepts various command inputs for controlling the design verification system 101 and for entering data defining circuit elements and constraints.

The processor 103 is connected to various memories in the addressable memory 115 through data bus 117. Connected to the data bus 117 are a constraint library 121, a constraint verification library 119, a verification engine 123, a layout database 125, and an application programming interface 113. In the preferred embodiment, the constraint library 121, the constraint verification library 119, and the layout database 125 are implemented using object oriented programming techniques, as object oriented design naturally supports the use of object inheritance, which is useful in the design of circuit layouts, and the verification of design constraints.

Unlike conventional verification engines, the verification engine 123 of the present invention is extensible and allows for use of a variety of verification procedures that are provided separately by the designer or with the design verification system 101. The verification engine 123 provides a general mechanism for execution of verification procedures, but does not itself include verification procedures for verifying specific constraints. Instead, the application programming interface 113 provides an interface between the designer and the verification engine 123, allowing the designer to create constraints and verification procedures, whereon the application programming interface 113 registers the verification procedures with the verification engine 123.

The layout database 125 contains a coordinate representation of a printed circuit or multichip module layout that defines each of the circuits is elements in the circuit layout, and their relative placement and connections to one another. The circuit elements are stored as objects, each with appropriate attributes, including instances of various constraints applicable to each circuit element. The constraint library 121 stores a set of design constraints that are applicable to the design of the circuit layout stored in the layout database 125. The constraint verification library 119 contains a number of constraint verification procedures, or design rule checkers, for determining whether the circuit layout meets the specified constraints maintained in the constraint library 121 and selected for use with the circuit layout. The verification engine 123 uses designated verification procedures in the constraint verification library 119 to determine the compliance of the circuit layout with constraints checked by the verification procedures. The application programming interface 113 allows the designer to register verification procedures in the constraint verification library 119 with the verification engine 123, and further allows the designer to define new verification procedures and constraints for use on the circuit layout.

Figure 2:
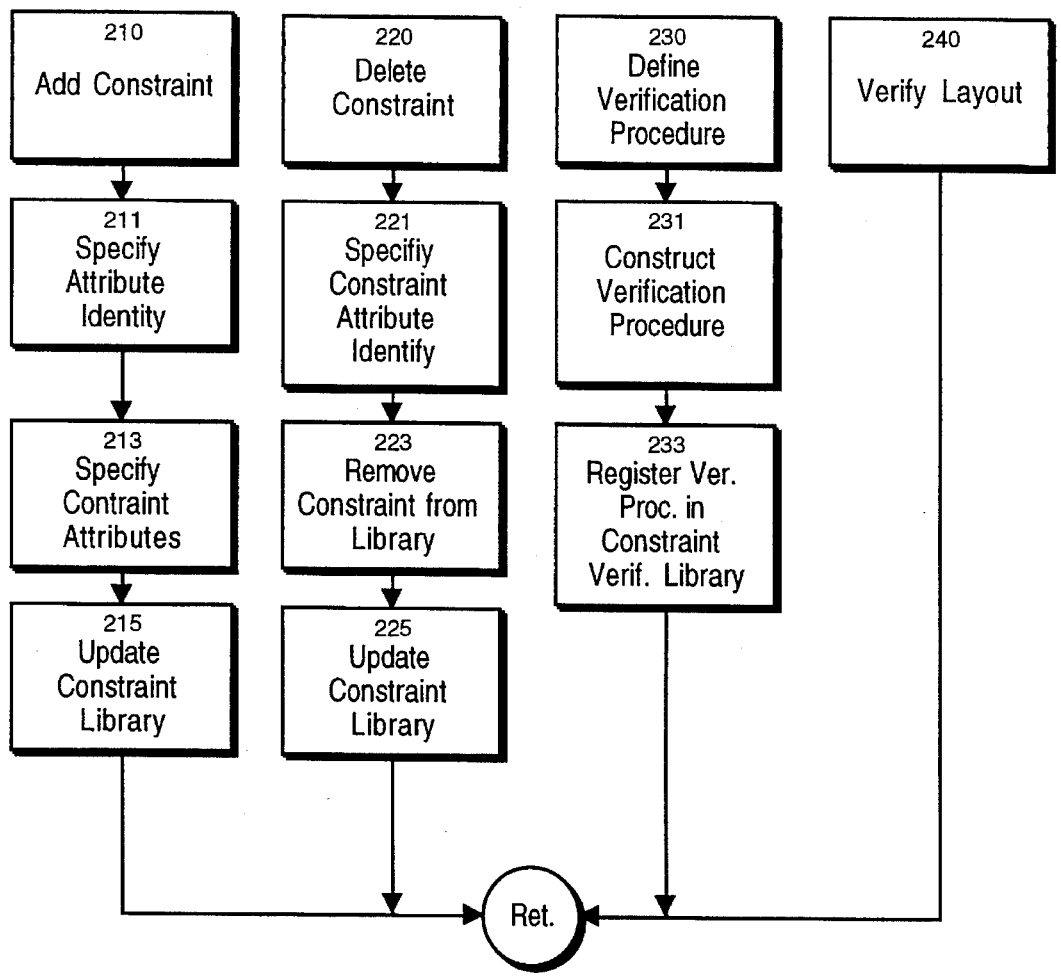
FIG. 2 is set of flowcharts for various operations of the design verification system.

Referring now to FIG. 2 there are shown flowcharts for the basic functions of the design verification system 101. These basic functions including adding 210 a new type of constraint for checking the circuit layout, deleting 220 a given constraint, defining 230 a constraint verification procedure, and verifying 240 a circuit layout.

A new constraint type for use with the circuit layout is added 210 to the design verification system 101 as follows. First, the designer specifies 211 a constraint attribute identity for the new constraint that relates the new constraint to a specific type or class of circuit elements in the circuit layout. For example, specifying that the new constraint has a constraint attribute identity of type "net" relates the new constraint to all net type circuit elements, that is, to all routing connections. Specifying the constraint attribute identity allows the verification engine 123 to execute a verification procedure on the appropriate circuit elements. It further allows the verification engine 123, during the verification process, to determine the proper precedence order for applying the constraints, using inheritance relations for the circuit elements, and any user specified precedence relations. In conventional layout design, individual or groups of circuit elements are instantiated from defined classes, each of which have associated with them defined constraints. The classes, and hence instances of the classes, are hierarchically related, such that the constraints for a given circuit element include all the constraints from the originating class and its superclasses. This hierarchical order defines the precedence used during execution of a verification procedure, but may be altered by the user to override the default precedence values to force the use of specific constraints. The specification of the constraint attribute identity thus places the new constraint into the hierarchy of constraints for determining its precedence.

The designer then specifies 213 a number of attributes for the constraint, as illustrated in FIG. 4, which shows the data structure of a constraint. In the preferred embodiment, a constraint 400 includes the following attributes: A constraint definition name 401 identifies the particular constraint with a string value, facilitating the designer's ability to identify a particular constraint. A constraint identity 403 is a unique integer value for the constraint. The constraint identity 403 is used by the system to uniquely identify a constraint, and thus it may not be duplicated, whereas the designer may use the same constraint definition name 401 with multiple constraints. A constraint by substrate flag 405 is a boolean value that determines whether the constraint is associated with specific layers of the printed circuit board of the circuit layout. This allows the verification engine 123 to apply the constraint when such specific layers are verified. A class attribute identity 409 classifies the constraint into various sets, such as net spacing constraints, net line constraints, electrical constraints, and the like, so that such sets can be modified or applied as a group. The designer may then verify all of the constraints in a group at a time. A constraint data type 411 identifies the type of data, for example, integer, floating point, and the like, for the constraint. A constraint units type 413 identifies the units for the constraint, for example a constraint may be in Ohms, voltage, amperes, mils, and the like. A constraint operation flag 415 is a boolean flag indicating whether the design verification system 101 should check the constraint with the appropriate verification procedure.

The constraint attributes also include information used by the design verification system 101 to determine the proper design verification procedure to employ on the constraint A constraint precedence value 419 is used to specify the ordering of constraints applied to a circuit element where multiple different constraints can be applied. This allows the designer to specify that a given constraint for a particular connection line, for example, is to be applied instead of a constraint that applies more generally to connection lines in the same area of the circuit layout, or to all connections on a connection net. The object list 421 is used to identify the specific circuit elements or objects to which the constraint is to be applied by the verification engine 123. The object list 421 is used instead of directly specifying a verification procedure because it allows the design verification system 101 to determine the appropriate verification procedure when the verification is actually to be performed, instead of when the verification procedure is compiled, and without having to recompile the verification engine 123 itself. Unlike conventional verification engines where the verification procedure is either compiled with the verification engine, or dynamically bound to the verification engine during operation by directly passing a pointer to the verification procedure, the verification procedure here is passed indirectly to the verification engine 123 when the object to which the verification procedure applies is retrieved.

Other constraint attributes are used to control the operation of the verification engine 123 when the constraint is verified. A conservative function pointer 423 allows the verification engine 123 to satisfy a constraint for a circuit element that is subject to two different constraints of the same type and precedence by using the more conservative valued constraint. For example, various layers of a circuit layout may have line width constraints of equal precedence that specify the maximum line width for connection lines passing though the layer or area. If a connection line passes through two overlapping areas, one with a 10 mil constraint, and another with a 20 mil constraint, the conservative function pointer 423 will invoke a function to return the 10 mil value for the line, thus satisfying both constraints. A delete function pointer 425 causes the verification engine 123 to delete design rule checking errors for the specific constraint from the circuit layout before a verification is performed, thereby restoring the layout to a pre-verification state for the specific constraint. In the preferred embodiment, the operation of the design verification system 101 is interactive, with each constraint being verified as the designer instantiates new circuit elements and applies them to the circuit layout. However, it is not always desirable to have a circuit element verified while it is being added to the layout. For example, where the designer is adding a connection net to a number of existing elements, it is preferable to defer the verification of the constraints on the net until all the connections are made. For this purpose, a defer check flag 427 allows the system 101 to defer the verification of the specified constraints until the designer instructs the system 101 to verify the constraints. This provides for an improvement in system performance by reducing redundancy in verification, and allowing the designer to verify the circuit when it is more completely defined. Other constraint attributes appropriate to the circuit layout may be used as desired. Once the desired constraint attributes have been specified, the constraint library 121 is updated 215 with the new constraint and its attributes.

Occasionally, the designer may decide to remove a constraint from the constraint library, where the constraint is no longer needed, or is supplanted by other constraints. In such cases, the designer deletes 220 the constraint by specifying the constraint identity 403 to retrieve the constraint from the constraint database, and instructing 223 the system to remove the constraint. The system 101 then updates 225 the constraint database 121 accordingly, removing the identified constraint.

In order to use a defined constraint, a verification procedure must be provided by the designer for the new constraint. Accordingly, the design verification system 101 supports the creation 230 of new verification procedures, and a mechanism for relating those verification procedures to specific constraints in the constraint library 121. The application programming interface 113 provides an interface for receiving or creating a source code file, preferably written in SKILL, a design language provided by Cadence Design Systems, that contains a verification procedure (other programming languages may also be used as appropriate to the application of the design verification system 101). The verification procedure is used to verify a particular type of constraint in the constraint library. The verification procedure may also provide verification of relational constraints that depend on the relationships or attributes of a number of circuit elements; this is provided using the constraint dimension attribute and the hierarchical relationships of the circuit elements. In creating the procedure the designer specifies 231 a verification function with parameters for the constraint to be checked, including identification of related circuit elements. The verification procedure is then compiled by the design verification system 101.

In order for the verification procedure to be applied to the correct constraints, the verification procedure is registered 233 in the constraint verification library 119. Registration allow the design system 101 to associate each verification procedure with specific circuit elements, without having to recompile the verification engine 123. The constraint verification library 119 is provided with a pointer to the verification procedure and a list of the circuit objects to which the verification procedure applies. The application programming interface 113 supports a graphical user interface that includes a form with which the designer registers the verification procedure in the constraint verification library 119. Using the form the designer designates at least one circuit element type in the circuit layout to be verified by a given verification procedure. The application programming interface 113 then instantiate a new record in the constraint verification library 119 that contains a pointer to the verification procedure and the list of circuit elements to be verified by the verification procedure.

Figure 3:
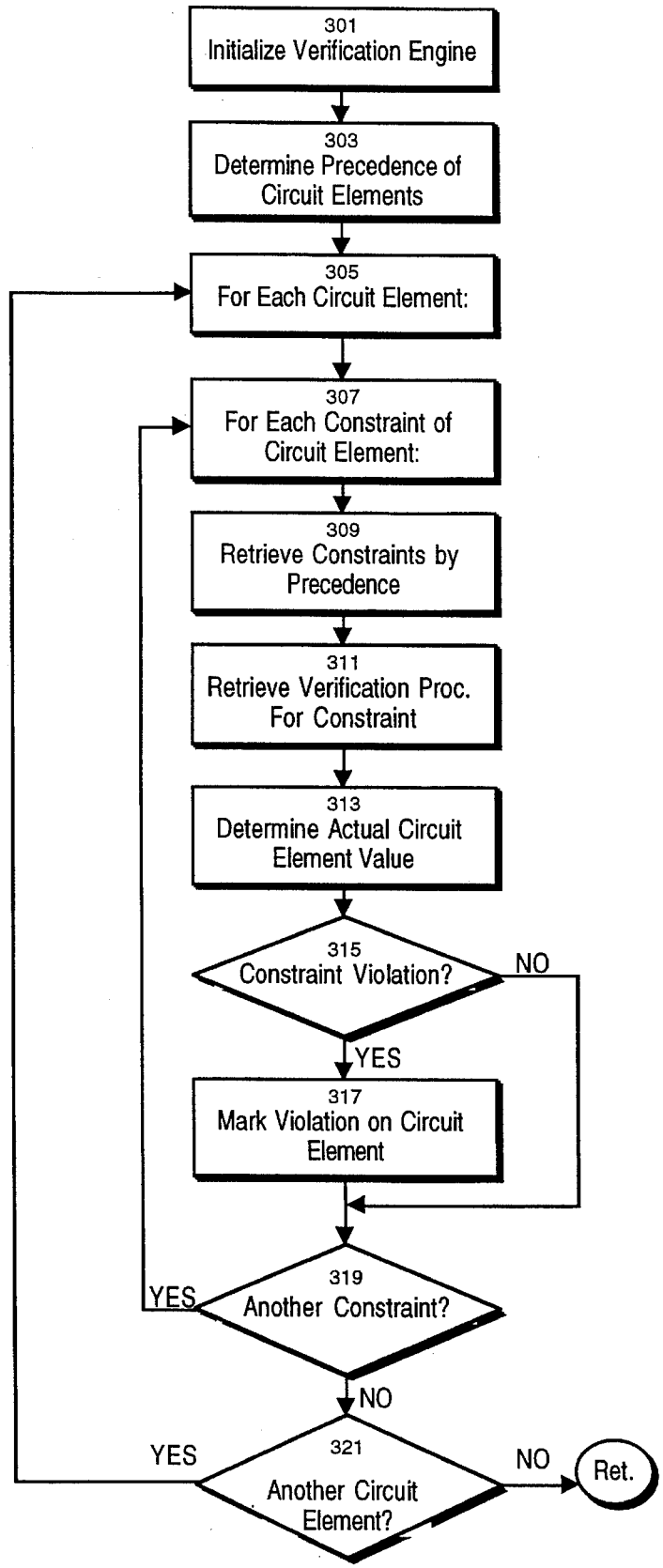
FIG. 3 is a flowchart of one embodiment of the verification process.

Once any number of constraints and verification procedures have been added 210, and the verification procedures have registered 233 the designer may then execute various verification procedures on the circuit layout to verify 240 the circuit. The process for verification 240 using the verification engine 123 is shown in FIG. 3. The design verification system 101 initializes 301 the verification engine 123, establishing appropriate memory structures in the addressable memory 115 for performing the verification. Based on the circuit elements to be verified, the verification engine 123 determines 303 the precedence of the circuit elements. This precedence is based on the inheritance network of the circuit elements in the circuit layout. Beginning 305 with a first object or circuit element in the circuit layout, the constraint types to be applied to the circuit element are determined 307. As stated above, the constraint library 121 includes records of each constraint and the objects to which it applies. By reviewing the library for a particular circuit element, the system 101 determines the appropriate constraints to be applied. Once the constraint type is determined, the appropriate constraint is retrieved 309 from the constraint library 121 according to the precedence of the constraints. For example, for verifying a connection line in a given area of a circuit, there may be constraints for the particular line, for the connection net itself, and for all connection lines in the circuit area or plane. If a value is specified for a particular constraint on the line, and that constraint has higher precedence then the area-based constraint, it will be applied. Conversely, if the area-based line constraint is of higher precedence it will be used instead of the particular line constraint, or if there is no constraint for the particular line. Once the appropriate constraint is determined 309, a pointer to a verification procedure for that constraint is retrieved 311 from the constraint verification library 119, and passed to the verification engine 123. The constraint is then checked by determining 313 the actual value of the circuit element with respect to the type of constraint using the verification procedure, the verification engine 123 executing the verification procedure to perform the evaluation of the circuit element. If the value of circuit element does not satisfy 315 the constraint, then a violation of the constraint is marked 317 for the circuit element, and stored for later retrieval and reporting. If there is another constraint 319, the next constraint is retrieved 307 for the circuit element. This loop 307–319 is repeated for each constraint applicable to the circuit element. Once all the constraints have been checked, the verification engine 123 determines 321 if there is another circuit element to be verified, and repeats loop 305–321 for each circuit element. Once all of the circuit elements have been verified, the designer is then able to retrieve the design rule violations that were marked 317 and correct them in the circuit layout. Those of ordinary skill in the art will understand that the particular process steps described here for verification 240 can be applied in various sequences to achieve the same result of verifying the circuit layout. In such alternate processes, a verification engine, such as the one described above, should be able to retrieve the verification procedures for each circuit element during actual runtime operation, with the binding of the verification procedure to the verification engine 123 delayed until actual execution on a specific circuit element. The verification engine 123 should be able to retrieve the appropriate verification procedure indirectly, by retrieving only the constraints for a selected circuit element.

In summary, the design verification system of the present invention provides for increased flexibility and adaptability of the system in the design and verification of circuit layouts. The system allows a designer to integrate customized or newly developed constraints and verification procedures into an existing verification system. The designer may then adapt the design system to newly developed fabrication technologies that require specific constraints to be used during circuit design.

I claim:

1. In an computer aided design system for the design of an electronic circuit, a method of verifying design constraints in the electronic circuit, the electronic circuit including a selected plurality of interconnected components, the method comprising the steps of:

defining a design constraint for a component of the electronic circuit;

providing a verification engine for executing a verification procedure verifying the design constraint of the component;

providing a programming interface for defining the verification procedure verifying the design constraint;

defining the verification procedure in the programming interface, the verification procedure remaining independent of the verification engine until execution of the verification procedure; and executing the verification procedure with the verification engine to verify the design constraint.

2. The method of claim 1 wherein the step of defining a design constraint further comprises the steps of:

selecting a component type in the electronic circuit;

defining a design constraint for components of the selected component type; and designating a verification procedure for verifying the design constraint for the selected component type.

3. The method of claim 1, wherein the step of defining the verification procedure comprises the steps of:

designating a design constraint for verification;

defining a verification procedure for verifying that a component satisfies the designated design constraint applicable to the component; and, registering the verification procedure into a constraint verification library.

4. The method of claim 1, further comprising the steps of:

defining for a design constraint of a component in the circuit a precedence value for ordering the verification of the design constraint with respect to other design constraints such that the design constraint of a component having a highest precedence is used to verify the component.

5. The method of claim 1, wherein the step of executing a verification procedure with the verification engine further comprises the steps of:

determining the design constraint applicable to the component;

retrieving the verification procedure applicable to design constraint from a constraint verification library;

determining an actual value of the component with respect to the design constraint, using the verification procedure; and determining if the actual value of the component violates the design constraint.

6. A computer automated design system for verifying design constraints in an electronic circuit, the electronic circuit including a selected plurality of interconnected components, the system comprising:

a processor for executing stored verification procedures, and for retrieving data from memory;

a component library memory, operatively coupled to the processor, for storing a database of components for creating an electronic circuit, each component having a component type, and a design constraint;

a circuit memory, operatively coupled to the processor and the component library memory, for storing an electronic circuit as a hierarchy of interconnected components, each first component inheriting the design constraints of any second component including the first component;

a constraint memory, operatively coupled to the processor, for storing a design constraint for a component of the electronic circuit;

a programming interface, managed by the processor, for defining the verification procedure verifying the design constraint;

a procedure memory, operatively coupled to the programming interface, for storing the defined verification procedure; and a verification engine, operatively coupled to the processor and the procedure memory, for controlling the processor to retrieve from the procedure memory and execute a verification procedure verifying the design constraint of the component.

7. The system of claim 6, further comprising:

constraint definition means, operatively coupled to the constraint memory and the processor, for defining a design constraint for components of the selected component type.

8. The system of claim 6, wherein programming interface further comprises:

verification registration means, operatively coupled to the procedure memory and the design verification engine, for linking a verification procedure in stored in the procedure memory with at least one constraint stored in the constraint memory, wherein the verification procedure is retrieved from the procedure memory when a constraint in the constraint memory is passed to the verification engine for verification.

9. The system of claim 6, further comprising:

precedence means, operatively coupled to the constraint memory and the processor, for defining for a design constraint of a component in the circuit a precedence value for ordering the verification of the design constraint with respect to other design constraints, such that the design constraint of a component having a highest precedence is used to verify the component, the precedence value stored in association with the design constraint in the constraint memory.

* * * * *